United States Patent [19]

Shih

[11] Patent Number: 4,569,829
[45] Date of Patent: Feb. 11, 1986

[54] MBE SOURCE BAKEOUT SYSTEM

[75] Inventor: Hung-Dah Shih, Plano, Tex.

[73] Assignee: Texas Instruments Incorporated, Dallas, Tex.

[21] Appl. No.: 551,660

[22] Filed: Nov. 10, 1983

[51] Int. Cl.[4] .................................................. C30B 0/6
[52] U.S. Cl. .......................... 422/247; 156/DIG. 103; 118/726
[58] Field of Search ................ 422/247; 156/610, 612; 118/719, 724, 726; 427/38, 86, 248.1

[56] References Cited
U.S. PATENT DOCUMENTS
4,464,342 8/1984 Tsang .................................. 422/247

OTHER PUBLICATIONS
Pamplin, Crystal Growth 2nd Ed. Pergamon, NY, 1980 pp. 221–228.

Primary Examiner—Hiram H. Bernstein
Attorney, Agent, or Firm—Carlton H. Hoel; Robert O. Groover; James T. Comfort

[57] ABSTRACT

A molecular beam epitaxy system including a growth chamber and an analysis chamber, both connected to ultrahigh vacuum pump systems. The analysis chamber includes a source outgassing mount, so that, while growth is proceeding in the growth chamber, a newly received source can be outgassed in the special mount connected to the analysis chamber. Preferably the exhausted cryogenic gases from the cryo shield in the growth chamber are used to cool the source outgassing mount on the analysis chamber, to minimize the contamination of the analysis chamber by contaminants outgassed.

6 Claims, 4 Drawing Figures

MBE SOURCE BAKEOUT SYSTEM

BACKGROUND AND SUMMARY OF THE INVENTION

The present invention relates to molecular beam epitaxy (MBE) systems.

In molecular beam epitaxy, thin film deposition is achieved by directing molecular beams onto a substrate in an ultra high vacuum. Preferably the beams are not ionized, but are neutral molecular or atomic species, whence the name of the process. The substrate is heated to a temperature where kT is large enough to permit a deposited atom to move laterally for an average distance of at least several angstroms, to permit the deposited atoms to find their energetically preferred sites. Thus, MBE permits growth of thin films with extremely high crystalline quality. The MBE technique is generally well known, and has been widely discussed. See, for example, the following review articles, which are hereby incorporated by reference:

A. Y. Cho and J. R. Arthur, in *Progress in Solid State Chemistry*, edited by J. McCaldin and G. Somorjai (Pergamon, New York, 1975), Vol. 10, p. 157;

L. L. Chang, in *Handbook on Semiconductors*, edited by S. P. Keller (North-Holland, Amsterdam, 1980), Vol. 3 Chapter 9;

C. E. C. Wood, in *Physics of Thin Films*, edited by C. Haff and M. Frankcombe (Academic, New York, 1980), Vol. 11, p.35;

C. T. Foxon and B. A. Joyce, in *Current Topics in Materials Science*, edited by E. Kaldis (North-Holland, Amsterdam, 1981), Vol. 7, Chapter 1.

Molecular beam epitaxy is very attractive as a product technology for many applications, due to its unique capabilities. MBE easily produces hetero-epitaxial structures, wherein an epitaxial layer of one material is epitaxially deposited onto an underlying layer of a different material. The abrupt epitaxial transitions which can thus be achieved can be rapidly alternated to achieve superlattice structures, wherein, as the different epitaxial layers become very thin, some anomalous and highly desirable properties appear. Such structures are very difficult to make in any other way. MBE can also be used to make strained superlattices, wherein materials which are not lattice-matched in isolation are nevertheless grown in a perfect epitaxial structure. That is, materials which have the same crystal structure, but which would not have the same lattice spacing normally, can not be grown epitaxially by conventional methods. For example, the lattice constant of $InAs_{0.4}Sb_{0.6}$ is 0.4% less than that of $InAs_{0.27}Sb_{0.73}$. Thus, if one attempts to grow an epitaxial layer of $InAs_{0.4}Sb_{0.6}$ on a $InAs_{0.27}Sb0.73$ substrate by conventional methods such as chemical vapor deposition, the two lattices would not be matched. That is, it is desirable to have the interface between the two materials preserve the crystalline structure of the materials, so that the first lattice is a smooth continuation of the second lattice, except that more arsenic atoms and fewer antimony atoms are now found on the Group V sites. This can not be achieved by conventional methods, but is readily achieved in superlattice structures by MBE. MBE also promises other unique capabilities, such as epitaxial deposition of insulators over semiconductors, metals over insulators, etc.

However, attractive as these capabilities are for semiconductor device fabrication, MBE systms at present are primarily a laboratory tool rather than a production tool, simply because the throughput of MBE systems is slow. In part, the slow throughput of MBE systems is unavoidable, since it is difficult to achieve good quality deposited material if the deposition rates used are greater than several microns per hour. However, in large part this problem of slow throughput has been due to the difficulties of wafer handling.

Thus, it is an object of the present invention to provide an MBE system having reduced time requirements for wafer handling.

A problem in conventional MBE systems is outgassing of the sources. As shown in FIG. 3, a conventional MBE evaporation source is a small crucible (in which the source material will be placed), mounted on a vacuum flange together with a resistive heater, a heat shield, and a thermocouple. This structure may contain volatile contaminants, which are likely to escape when the source is heated to the temperatures used for evaporation of the source material.

Therefore, for best quality MBE growth, it has been found desirable to outgas the source, before the source material is actually placed in the crucible, at a temperature of about 1400 C. or higher for at least several dozen hours. After the source material is placed in the crucible, a second bakeout step, at about 50° over the source evaporation temperature, is performed for a shorter period of about 1 hour. A short exposure to air subsequent to these outgassing steps is not harmful, since these steps are not directed merely at adsorbed water and other low-temperature contaminants, but are directed at removing the high-temperature contaminants which may initially be present in the crucible and in the material of the source structure.

However, while this source outgassing provides better quality grown material, it is obviously quite time consuming. In particular, since the outgassing must be performed under high vacuum conditions, it could be performed with a source in place in the growth chamber of the MBE system, but this would obviously tie up the growth chamber of the MBE system for extended periods and therefore further degrade the already low throughput of the MBE system.

It would be possible to provide a separate high vacuum system for outgassing the sources, but this would obviously be expensive, not only in capital cost but also in technician time, due to the system bakeout and other routine maintenance steps which are periodically necessary for any operating ultra high vacuum system.

Thus, it is an object of the present invention to provide a molecular beam epitaxy system which includes means for outgassing sources without degrading throughput of the system.

It is a further object of the present invention to provide a MBE system which incorporates means for outgassing molecular beam sources, without degrading throughput of the system and without requiring any additional vacuum system.

The present invention provides this objective by providing a molecular beam epitaxy system which includes, as is conventional, more than one separate ultra high vacuum chamber. That is, a growth chamber is separated from a sample analysis chamber by a vacuum valve, through which wafers can be passed and which can be closed to isolate the growth chamber from the analysis chamber. In the present invention, the analysis chamber includes a source outgassing fixture, into which one source can be temporarily attached, so that source outgassing can be performed in the secondary chamber, after a wafer has been loaded into the growth chamber, while growth is proceeding in the growth chamber. Thus, no additional ultra high vacuum facility is required, but source outgassing can be performed with no degradation of throughput.

According to the present invention there is provided:

A molecular beam epitaxy system comprising:

A vacuum growth chamber comprising a substrate support and a plurality of effusion sources;

means for exhausting said growth chamber to ultra-high vacuum;

a second chamber operatively connected to said growth chamber, said second chamber comprising a vacuum chamber connected to a second means for exhausting said second chamber to ultrahigh vacuum;

means for transferring wafers between said growth chamber and said second chamber; and a source outgassing mount mounted on said analysis chamber, said source outgassing mount comprising a vacuum flange adapted to receive one of said sources for outgassing.

BRIEF DESCRIPTION OF THE DRAWINGS

The present invention will be described with reference to the accompanying drawings, which are hereby incorporated by reference, wherein.

DESCRIPTION OF THE PREFERRED EMBODIMENTS

As discussed above, the present invention teaches a molecular beam epitaxy (MBE) system having several novel features. The general configuration of the MBE system will first be discussed, and then the various novel features, with their alternative embodiments, will separately be discussed.

Figure 1:
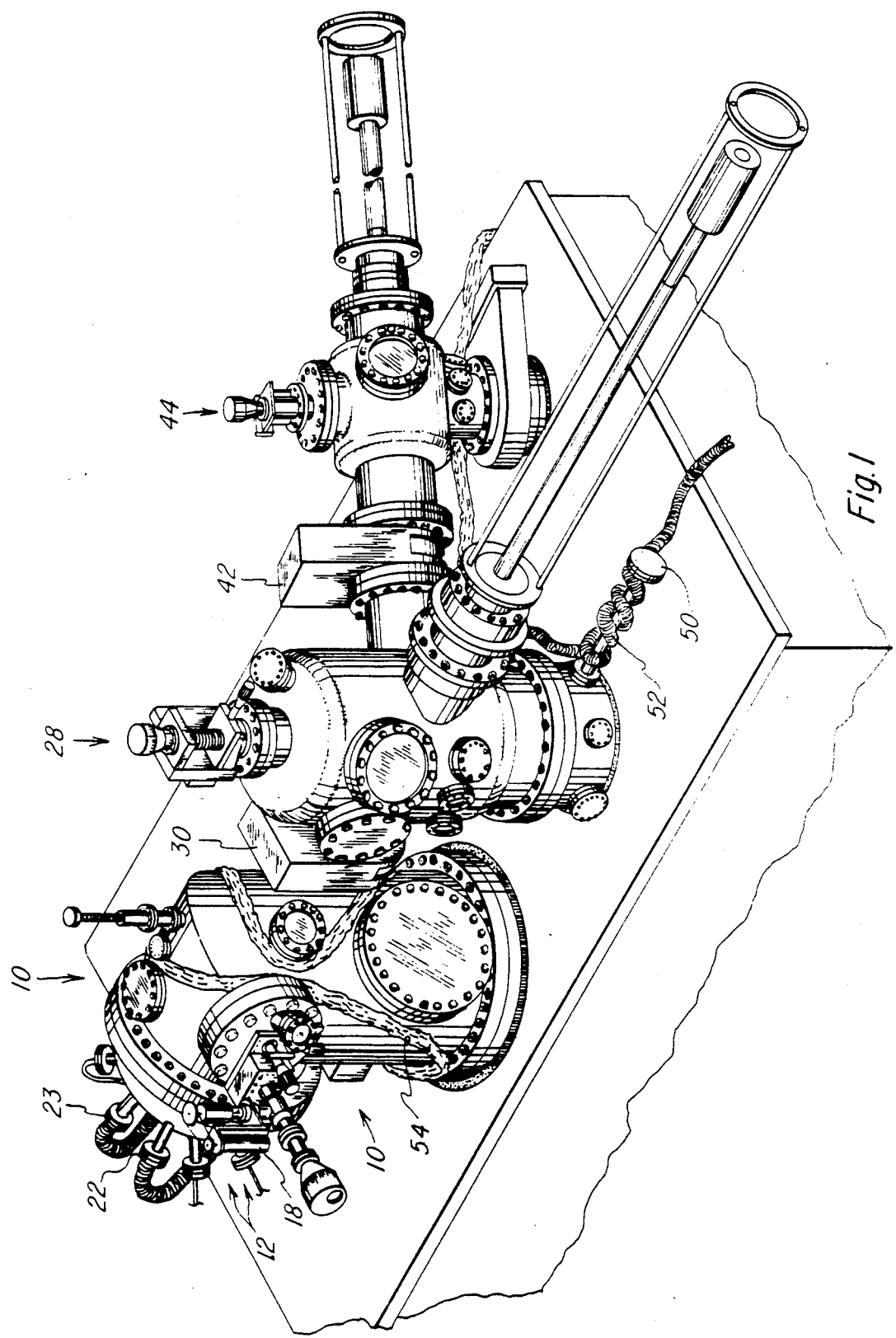
FIG. 1 shows a sample MBE system embodying the present invention.

FIG. 1 shows generally an MBE system which may embody the present invention. The system, in this embodiment, consists of three separate vacuum chambers, with valves interconnecting them. A growth chamber 10 is the vacuum chamber in which actual thin film deposition occurs. Mounted on this chamber are a plurality of sources 12 (effusion cells of Knudsen type). Each source 12 normally includes a shutter, so that, to deposit a selected species or combination of species, the operator can supply drive current to the resistive heating elements in the desired sources 12 and unshutter them to provide molecular beams under ultra high vacuum conditions. A substrate holder 14 is positioned downwardly facing and generally facing these sources 12, so that when the sources 12 emit molecular beams they will impinge on the substrate holder and can be incorporated in film growth. The substrate holder 14 normally incorporates a resistive heating element, and is connected to a rotary drive 18 so that the substrate holder 14 can be continuously rotated during the growth process, to promote more uniform growth. The inside of the growth chamber 10 is lined with a cryo shield, which includes plumbing connected to external liquid nitrogen supply and exhaust ports 22 and 23. During growth, the cryo shield 20 is cooled to approximately 77 degrees K., to reduce background contaminants during growth.

Figure 4:
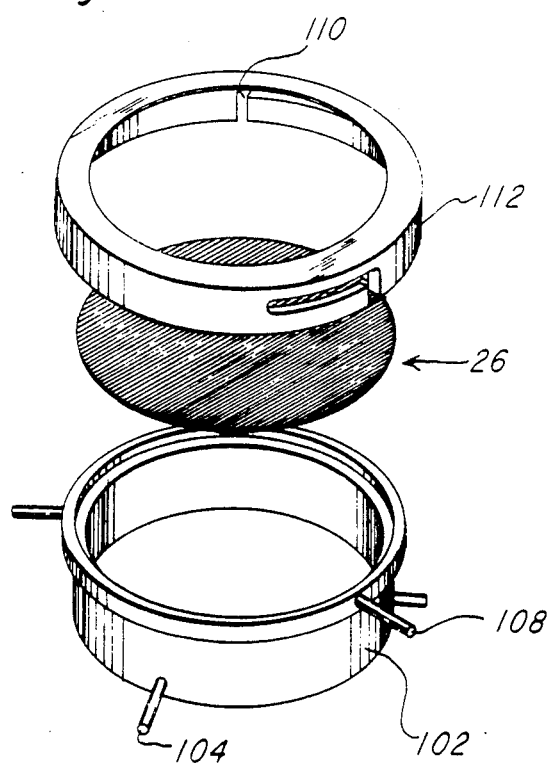
FIG. 4 shows the substrate holder and retaining ring used in the presently preferred embodiment of FIG. 1.

The rotating substrate holder 14 normally remains in the chamber. However, a substrate holder 24 can be mounted and dismounted from a substrate holder 14 under vacuum. This substrate holder 24 will typically have a wafer 26 FIG. 4 attached to it.

The growth chamber 10 is separated from an analysis chamber 28 by a valve 30. The valve 30 must be capable of withstanding ultra-high vacuum without leakage to the outside world. Note that the valve 30 is preferably not placed where it can see the sources 12, to avoid plating excessive amounts of the molecular beam species onto the valve. Alternatively, a shutter could be placed in front of the valve.

Figure 2:
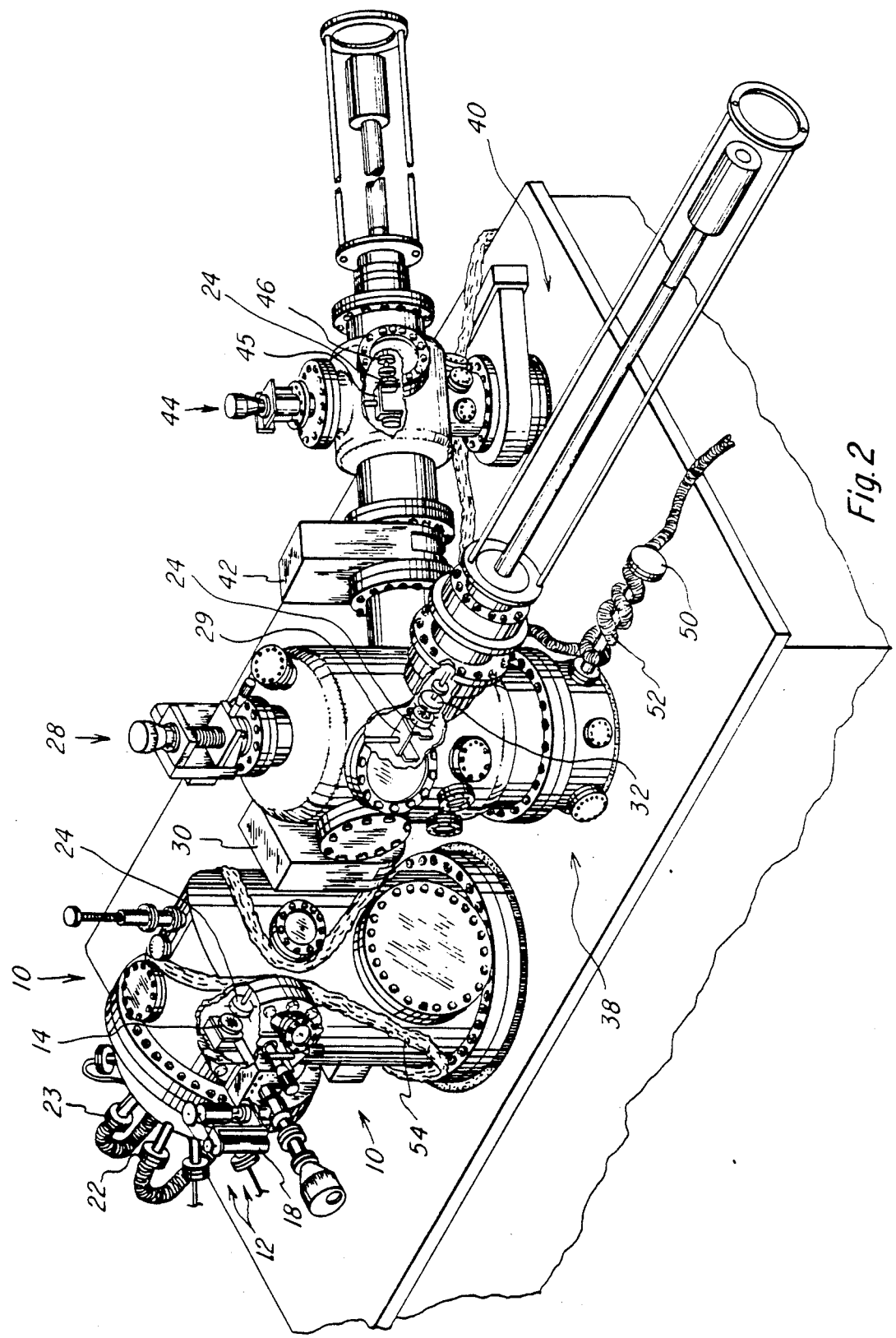
FIG. 2 in a cutaway view of FIG. 1, showing further details of wafer transport mechanisms.

A first transfer arm 32 (FIG. 2) is aligned with the valve 30, so that the first transfer arm 32 can transfer a wafer 26 and a substrate holder 24 to the growth chamber 10 from the analysis chamber 28 and back. The analysis chamber 28 will typically include analysis equipment so the condition of the grown film can be inspected without exposing it to atmospheric contamination. The analysis equipment 34 may typically include instruments such as Auger analyzer, ESCA (electron spectroscopy for chemical analysis) analyzer, SIMS, etc.

The growth chamber 10 is equipped with its own high vacuum pump (e.g. an ion pump), and the analysis chamber 28 has its own high vacuum pump 38. Similarly, the preparation chamber 44 has its own vacuum pump 40. The growth chamber and analysis chamber will typically both be operated at pressures in the neighborhood of $1 \times 10^{-11}$ Torr, whereas the preparation chamber, which is frequently opened to the atmosphere, is normally operated at pressures only around $1 \times 10^{-8}$ Torr.

A second valve 42, similar to the valve 30, connects the analysis chamber 28 to the preparation chamber 44, and a second transfer arm 46 is positioned in line with the valve 42 to transfer wafers and substrate holders from the preparation chamber 44 into the analysis chamber 28. The vacuum feedthrough for the second transfer arm 46 is essentially the same as that for the first transfer arm 32.

The sequence of operations involved in wafer transfer are described in detail. It will be recognized by those skilled in the art that this description particularly relates to an MBE system originally manufactured by Riber, but the invention is also applicable to many other MBE systems, and this particular system's operation is described, being in the presently preferred best mode, in the greatest possible detail.

While the valve 42 is closed, the preparation chamber 44 is opened to the atmosphere, and three wafers, each assembled to a substrate holder and retaining ring, are loaded into the preparation chamber. One substrate holder is affixed to the slots on the end of the second transfer arm 46, which are positioned to engage the pins around the circumference of the substrate holder, and the other two substrate holders are similarly engaged by slots in the first wafer carrier 45. The preparation chamber 44 is then closed, and a routing pump then brings the atmosphere therein down to an initial low pressure. The preparation chamber 44 is then connected to ion pump 40, and brought down to a reasonable vacuum, e.g.

$1 \times 10^{-8}$ Torr. Preferably one of the positions on the wafer mount 45 is provided with a heater, so that a wafer can be outgassed at low temperature (e.g. 200° C.) to minimize contamination of the high vacuum chambers. After a first wafer has been outgassed in the preparation chamber 44, the valve 42 is opened, and second transfer arm 46 transfers the wafer it is holding to the second wafer carrier 29 in the analysis chamber 28. This second transfer arm 46 is then retracted, the wafer carrier 45 is rotated so that the wafer which has just been outgassed is facing the transfer arm 46, the transfer arm 46 engages the substrate holder around this wafer, the wafer carrier 45 is rotated again so that the transfer arm 46 can pass through, and the transfer arm 46 again reaches into the analysis chamber to place this outgassed wafer onto the second wafer carrier 29. The second transfer arm 46 is then retracted, and the valve 42 is closed. The second transfer arm 46 now loads another wafer onto the heated position of the wafer carrier 45 for outgassing.

Meanwhile, depending on the substrate used, an ion bombardment step may now be performed in the analysis chamber 28 to clean the surface of the wafer for growth. However, this is not necessary with gallium arsenide. The second wafer carrier 29 is then rotated so that the wafer to be grown faces the first transfer arm 32, and the first transfer arm 32 is extended and rotated to pick up the wafer next to be grown. The second wafer carrier 29 is rotated so that the first transfer arm 32 can pass through it, and the valve 30 is then opened so that the first transfer arm can reach into the growth chamber. The substrate support is now rotated so that it faces the first transfer arm, and the first transfer arm is extended into the growth chamber 10 where it attaches the growth wafer by a rotary motion to the substrate support. (During all of this time, the cryo shield will be supplied with liquid nitrogen, so that its temperature is approximately 77 K.). The first transfer arm 32 will then be retracted and the valve 30 closed, and preparations for growth can begin. That is, the substrate support will now be rotated into the growth position, which in the presently preferred embodiment faces downward along an axis approximately 22½ degrees from horizontal. Initially, for a gallium arsenide wafer, the arsenic source will be powered to provided a background arsenic pressure of about $1 \times 10^{-5}$ Torr of arsenic in the growth chamber. While this arsenic overpressure is maintained, the heating filament in the substrate support will very briefly be powered sufficiently to run the wafer up to a temperature of about 630° C. This outgasses the wafer, i.e. causes the native oxides of gallium to sublime from the wafer surface. This step is performed only very briefly, to avoid excessive arsenic loss from the wafer surface. The wafer is then returned to a steady state growth temperature, of 600° C. in this example, and the desired sources for epitaxial growth are powered up and unshuttered. After the desired growth has been achieved, the arsenic cell only is left open, to again provide an arsenic overpressure of about $1 \times 10^{-5}$ Torr, while the wafer cools. After the wafer is cooled, the arsenic source is shuttered, and the above sequence of wafer transfers is repeated in reverse.

The end of such a sequence of operations is a set of three wafers, each still mounted between a substrate holder and a retaining ring and each having an epitaxial layer thereon, in the preparation chamber 44. Preparation chamber 44 is then opened to atmosphere, the grown wafers are removed, and new wafers, each in a substrate holder and a retaining ring, are mounted.

During the growth operation, as is well known to those skilled in the art, the wafer is heated to a temperature (e.g. 600° C.) sufficient to provide surface mobility for the As-deposited atoms for them to seek out their energetically favorable lattice positions, thus assuring good lattice quality. The temperature of the wafer 26 during growth must be carefully monitored. This can be done in at least two ways. In the presently preferred embodiment, an optical pyrometer 48 is used. This instrument looks through a view port in the wall of the growth chamber 10 so that it can see the wafer 26 during growth. Preferably the viewport is shuttered most of time to eliminate the deposition of reflective films on the viewport. Alternatively, a thermocouple can be mounted on substrate 14 in close proximity to the backside of substrate holder 24. To heat the wafer during growth, a resistive heating element 16 is also incorporated in the substrate support 14, close to the backside of the substrate holder 24. In fact, the substrate holder 24 is preferably made quite thin, to maximize the thermal coupling between the wafer 26 and heater 16.

The ultrahigh vacuum analysis chamber reduces contamination of the growth chamber vacuum, and also permits the condition of a wafer to be inspected exactly as it was grown. However, although these functions are extremely important, it should be noted that the analysis chamber is not typically actually being used for anything during the growth run for each wafer. One novel aspect of the present invention makes use of this idle time in the analysis chamber. In one novel aspect of the present invention, a source outgassing mount 50 is provided on the analysis chamber 28. The source outgassing mount 50 is preferably a cylinder long enough that a source 12 which is temporarily mounted in the source outgassing mount does not actually protrude into the analysis chamber. When a new source is received, it is mounted, without any source material being located in the source crucible, onto the source outgassing mount 50, prior to a sequence of wafer transfer operations. After a wafer 26 has been loaded into the growth chamber and growth has been begun, the resistive heater in the source is activated, to heat the source to at least about 1400° C. for at least several dozen hours. This outgassing step removes a large part of the residual impurities which would otherwise be baked out of the crucible during the actual source evaporation step.

Figure 3:
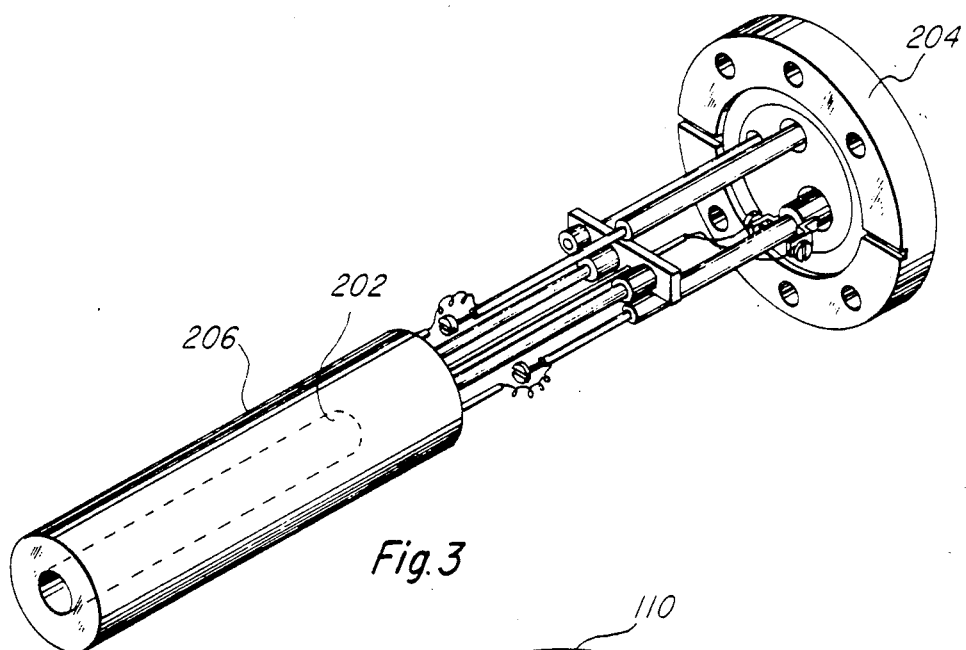
FIG. 3 shows a sample effusion source used in the system of FIG. 1.

A sample molecular beam source (Knudsen effusion cell) of the prior art, as used in this arrangement, is shown in FIG. 3. That is, a crucible 202 is supported inward from a vacuum flange 204, and is surrounded by a heat shield 206. The crucible is heated by a resistive heater, and its temperature is sensed by thermocouple. An electrical feedthrough is provided for the resistive heater, and a separated electrical feedthrough is provided for the thermocouple.

Note that the source outgassing mount 50 incorporates a cooling tube 52. Normally an analysis chamber 28 is not provided with a cryo shield, since there is no source of hot species present in the analysis chamber. However, when the source outgassing mount 50 is attached, some form of cryo shielding is desirable, to reduce over heating of the analysis chamber 28. This is provided by the cooling tube 52 which is thermally connected to the source outgassing mount 50. Preferably the cooling tube 52 is connected to the liquid nitrogen exhaust 23 from the cryo shield 20 in the growth chamber. That is, it is not critical that the source outgassing mount 50 be held at exactly 77 K., so that the cold nitrogen from exhaust port 23 can be used again to reduce the temperature of the cooling tube 52 which is in close proximity to the high temperature source 12.

After this initial high temperature source bakeout has occurred, the source is demounted from the source outgassing mount 50 when next the preparation chamber 44 is open to atmosphere, and the source is reloaded with the source material. For example, an indium source would be reloaded with a small ingot (e.g. 50 grams) of indium of the highest attainable purity. The source 12 is then preferably mounted again on the source outgassing mount 50, and, after the system has been pumped down and a new wafer 26 has been loaded into the growth chamber 10 and growth is proceding, the source is again outgassed. However, the second optional outgassing step is performed at a temperature which is merely 50 degrees above the source of the evaporation temperature. For example, an aluminum source would typically be operated at a temperature of about 1000° C., and this source would therefore be outgassed at a temperature of 1050° C. However, an arsenic source would typically be operated at a temperature of only 250° C., and this source would therefore be outgassed at a temperature of only 300° C.

Of course the source outgassing mount 50 need not have this physical configuration. For example, the source outgassing mount 50 need not look directly into the analysis chamber, but a baffled connection may be provided, to catch more of the high temperature species emitted from the source during outgassing. Similarly, the source outgassing mount 50 could be made longer, to physically remove the high temperature source even farther from the analysis chamber 28. Naturally, the analysis equipment 34 will typically be shuttered during the actual outgassing operation. A valve or shutter could also be interposed between the source outgassing mount 50 and the analysis chamber 28, to minimize stray contaminants during wafer transfer and the analysis operations. In any case, the principal teaching is that, in a molecular beam epitaxy system which includes an ultrahigh vacuum growth chamber and also another ultrahigh vacuum chamber, the second ultrahigh vacuum chamber incorporates a source outgassing mount, so that sources can be outgassed in ultrahigh vacuum while a growth operation is proceding. A further teaching is that this source outgassing mount is cooled with the exhausted cryogenic gases from the cryo shield in the main growth chamber.

The above description has referred to a three chamber MBE system, wherein three separate vacuum chambers are provided, each with a high-vacuum pump and wherein isolation valves separate the chambers. However, the present invention is equally applicable to a two-chamber MBE system. The principal teaching is that, in an MBE system which includes an additional high vacuum chamber separate from the growth chamber, a source outgassing mount is located on a high vacuum chamber which is part of the system but which is not the growth chamber, for the protected outgassing of sources which is desirable. Thus, it should be noted that, in the present invention, the source outgassing mount 50 could be mounted on the preparation chamber 44 rather than on the analysis chamber 28.

It should also be noted that the source outgassing mount 50 is preferably closer to the ion pump in the analysis chamber than is in the wafer transfer path, i.e. than the wafer carrier 29 and the paths of the transfer arms 32 and 46. That is, in the sample configuration of FIG. 1, a high vacuum pump, such as an ion pump or a turbomolecular pump, is preferably located below the analysis chamber 28, although this is not separately shown. This means that the new source mounted on the source outgassing mount 50 can be left at high temperature continuously during wafer transfer operations, since the contaminants outgassed from the new source, if not collected on the cooled walls of the source outgassing mount 50, will probably diffuse downward toward the vacuum pump rather than upward toward the wafers located in the chamber.

The foregoing has described one growth operation in the operation of the MBE system. This description has assumed that the growth chamber 10 is kept in ultra high vacuum all the time. However, the equipment is of course received at atmospheric pressure, and must periodically be restored to atmospheric pressure for maintenance operations, mounting of new sources, etc. After the growth chamber 10 has been exposed to atmospheric or near atmospheric pressure, some sort of bakeout operation is necessary before it can reach ultrahigh vacuum. That is, the walls of the growth chamber will include a substantial mass of adsorbed water, hydrocarbons, and other volatile contaminants, and if an attempt is made to simply pump the chamber down to ultrahigh vacuum levels, these contaminants will gradually desorb from the walls, so that the pumping operation will take a tremendously long time and will never achieve a good vacuum. Thus, to remove these volatile species (mostly water vapor, and hydrocarbon), an initial bakeout is necessary. This is normally performed by enclosing the growth chamber 10 with a bake out oven, i.e. a heat shield incorporating radiant heaters, which can heat the whole growth chamber 10 to about 200 C. During this operation, it is of course necessary to disconnect the cryogenic gas connections, and also, to fit the furnace in place, it is normally necessary to disconnect other elements, including other electrical and plumbing connections.

As will be appreciated by those skilled in the art, the present invention can be practiced in a wide variety of modifications and variations, and is accordingly not limited except as specified in the accompanying claims.

What is claimed is:

1. A molecular beam epitaxy system comprising:
   a vacuum growth chamber comprising a substrate support and a plurality of effusion sources;
   means for exhausting said growth chamber to ultrahigh vacuum;
   a second chamber operatively connected to said growth chamber, said second chamber comprising a vacuum chamber connected to a second means for exhausting said second chamber to ultrahigh vacuum;
   means for transferring wafers between said growth chamber and said second chamber; and
   a source outgassing mount mounted on said second chamber, said source outgassing mount comprising a vacuum flange adapted to receive one of said sources for outgassing wherein said source outgassing mount comprises a tube extending out from said second chamber sufficiently far that a source mounted within said source outgassing mount does not protrude into said second chamber, said source outgassing mount comprises a coolant tube attached to said tube and said growth chamber further comprises a cryo shield and coolant supply and exhaust connections for said cryo shield, and where said coolant tube for said source outgassing mount tube is connected to said coolant exhaust connection of said growth chamber.

2. The system of claim 1 further including a value communicating between said vacuum growth chamber and said second chamber.

3. A molecular beam epitaxy system comprising:

a vacuum growth chamber comprising a substrate support and a plurality of effusion sources;

means for exhausting a said growth chamber to ultrahigh vacuum;

a second chamber operatively connected to said growth chamber, said second chamber comprising a vacuum chamber connected to a second means for exhausting said second chamber to ultrahigh vacuum;

means for transferring wafers between said growth chamber and said second chamber; and a source outgassing mount mounted on said second chamber, said source outgassing mount comprising a vacuum flange adapted to receive one of said sources for outgassing wherein said source outgassing mount comprises a tube extending out from said second chamber sufficiently far that a source mounted within said source outgassing does not protrude into said second chamber.

4. The system of claim 3, wherein said source outgassing mount comprises a coolant tube attached to said tube.

5. The system of claim 3 further including a valve communicating between said vacuum growth chamber and said second chamber.

6. The system of claim 4 further including a valve communicating between said vacuum growth chamber and said second chamber.

* * * * *